(12) United States Patent
Seo et al.

(10) Patent No.: US 11,651,711 B2
(45) Date of Patent: May 16, 2023

(54) DISPLAY DEVICE AND MANUFACTURING METHOD FOR THE SAME

(71) Applicant: Samsung Display Co., Ltd., Yongin-Si (KR)

(72) Inventors: Jeongweon Seo, Hwaseong-si (KR); Jahun Koo, Asan-si (KR); Jihyun Kim, Yongin-si (KR); Jinsoo Shin, Suwon-si (KR); Kiseok Cha, Suwon-si (KR); Joonhoo Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 67 days.

(21) Appl. No.: 17/239,910

(22) Filed: Apr. 26, 2021

(65) Prior Publication Data

US 2022/0068166 A1 Mar. 3, 2022

(30) Foreign Application Priority Data

Aug. 31, 2020 (KR) ........................ 10-2020-0110205

(51) Int. Cl.
*H05K 5/00* (2006.01)
*G09F 9/30* (2006.01)
*H05K 1/02* (2006.01)
*H05K 1/18* (2006.01)

(52) U.S. Cl.
CPC ............ *G09F 9/301* (2013.01); *H05K 1/028* (2013.01); *H05K 1/189* (2013.01); *H05K 2201/10128* (2013.01)

(58) Field of Classification Search
CPC ........ G09F 9/301; H05K 1/028; H05K 1/189; H05K 2201/10128

USPC ......................................................... 361/749
See application file for complete search history.

(56) References Cited

U.S. PATENT DOCUMENTS

| 6,027,958 A * | 2/2000 | Vu .......................... H01L 24/24 |
| | | 257/E21.705 |
| 6,657,606 B2 | 12/2003 | Kang et al. |
| 9,423,661 B2 | 8/2016 | Jeon et al. |
| 10,551,700 B2 | 2/2020 | Lee et al. |

(Continued)

FOREIGN PATENT DOCUMENTS

| KR | 10-0332438 | 4/2002 |
| KR | 10-2017-0104109 | 9/2017 |

(Continued)

*Primary Examiner* — Binh B Tran
(74) *Attorney, Agent, or Firm* — F. Chau & Associates, LLC

(57) ABSTRACT

A display device includes a display substrate comprising a polymer layer including a first non-bending area, a second non-bending area that overlaps the first non-bending area when viewed in a plan view, and a bending area arranged between the first non-bending area and the second non-bending area. A display element layer is disposed on the polymer layer. A plurality of signal pad groups is disposed in the second non-bending area and is configured to be electrically connected to the display element layer. An upper substrate is disposed on a top surface of the display substrate. A flexible circuit board comprising a plurality of connection pad groups is arranged in correspondence to the signal pad groups. An area of the upper substrate is larger than an area of the display substrate when viewed in a plan view.

18 Claims, 12 Drawing Sheets

(56) References Cited

U.S. PATENT DOCUMENTS

| | | | |
|---|---|---|---|
| 10,716,221 B2 | 7/2020 | Lee et al. | |
| 10,719,103 B2 | 7/2020 | Chung et al. | |
| 2017/0257953 A1* | 9/2017 | Lee | H05K 1/147 |
| 2017/0371376 A1* | 12/2017 | Chung | G02F 1/133305 |
| 2018/0160545 A1* | 6/2018 | Kim | H05K 3/3452 |
| 2019/0165332 A1* | 5/2019 | Kwon | H01L 51/5056 |

FOREIGN PATENT DOCUMENTS

| | | |
|---|---|---|
| KR | 10-2018-0002108 | 1/2018 |
| KR | 10-2018-0135513 | 12/2018 |
| KR | 10-2024860 | 9/2019 |
| KR | 10-2087196 | 3/2020 |

* cited by examiner

DISPLAY DEVICE AND MANUFACTURING METHOD FOR THE SAME

CROSS-REFERENCE TO RELATED APPLICATIONS

This application claims priority under 35 U.S.C. § 119 to Korean Patent Application No. 10-2020-01110205, filed on Aug. 31, 2020 in the Korean Intellectual Property Office, the disclosure of which is incorporated by reference in its entirety herein.

1. TECHNICAL FIELD

The present inventive concepts relate to a display device and a manufacturing method for the same, and more particularly, to a display device having a bezel area with a reduced size, and a manufacturing method for the same.

A display device displays various images on a display screen to provide information to a user. Typically, a display device displays information within an allocated screen that is surrounded by a frame. However, research has been conducted on display devices which do not include a frame to extend the size of the screen on which the information is displayed.

The display device includes electronic components for displaying information on the screen. The electronic components included in the display device are electrically connected through connections of pads. However, in a process of heat-pressing various substrates with pads arranged thereon, the substrates are stretched which cause the pads to be misaligned, and thus the reliability of the connections of the electronic components may decrease.

SUMMARY

The present inventive concepts provide a display device including an upper substrate having a larger area than a lower display substrate when viewed in a plan view, and a manufacturing method for the same.

According to an embodiment of the inventive concepts, a display device includes a display substrate comprising a polymer layer including a first non-bending area, a second non-bending area that overlaps the first non-bending area when viewed in a plan view, and a bending area arranged between the first non-bending area and the second non-bending area. A display element layer is disposed on the polymer layer. A plurality of signal pad groups is disposed in the second non-bending area and is configured to be electrically connected to the display element layer. An upper substrate is disposed on a top surface of the display substrate. A flexible circuit board comprising a plurality of connection pad groups is arranged in correspondence to the signal pad groups. An area of the upper substrate is larger than an area of the display substrate when viewed in a plan view.

In an embodiment, the polymer layer may include polyimide.

In an embodiment, the signal pad groups may include a plurality of signal pads arrayed in a first direction, wherein an opening is defined in the polymer layer in correspondence between the signal pad groups neighboring each other.

In an embodiment, a length of the opening in a second direction vertical to the first direction may be longer than each length of the signal pads in the second direction.

In an embodiment, the opening may include a plurality of sub-openings arrayed and defined in a second direction vertical to the first direction.

In an embodiment, the connection pad groups may include a plurality of connection pads arrayed in a first direction, and an opening may be defined in the polymer layer in correspondence between the connection pad groups neighboring each other.

In an embodiment, a length of the opening in a second direction vertical to the first direction may be longer than each length of the connection pads in the second direction.

In an embodiment, the opening may include a plurality of sub-openings arrayed and defined in a second direction vertical to the first direction.

In an embodiment, a first opening may be defined in the polymer layer in correspondence between the signal pad groups neighboring each other, and a second opening may be defined in the flexible circuit board in correspondence between the connection pad groups, wherein the first opening overlaps the second opening.

In an embodiment, the display device may further include a lower substrate configured to overlap the first non-bending area and arranged on a bottom surface of the polymer layer.

In an embodiment, an area of the upper substrate may be greater than that of the lower substrate when viewed in a plan view.

In an embodiment, the upper substrate and the lower substrate may be glass substrates.

In an embodiment, the display device may further include: a support layer arranged on a bottom surface of the first non-bending area and separated from the bending area.

In an embodiment, the display device may further include an impact absorption layer arranged between the support layer and the bending area.

In an embodiment, the display device may further include a protection layer configured to cover an outer side surface of the bending area and an exposed side surface of the upper substrate.

According to an embodiment of the present inventive concepts, a display device includes a display substrate comprising a polymer layer including a first non-bending area, a second non-bending area that overlaps the first non-bending area when viewed in a plan view, and a bending area arranged between the first non-bending area and the second non-bending area. A display element layer is disposed on the polymer layer. A plurality of signal pad groups is disposed in the second non-bending area and is configured to be electrically connected to the display element layer. An upper substrate is disposed on a top surface of the display substrate. A flexible circuit board comprising a plurality of connection pad groups is arranged in correspondence to the signal pad groups. An outer side surface of the bending area is arranged more inwardly than an outermost edge of the upper substrate.

In an embodiment, the display device may further include a lower substrate arranged on a bottom surface of the display substrate, wherein an edge of the lower substrate is arranged inner than the edge of the upper substrate.

According to an embodiment of the present inventive concepts, a manufacturing method for a display device includes providing a lower substrate. A display substrate is arranged on the lower substrate. The display substrate includes a polymer layer, a display element layer disposed on the polymer layer, and a plurality of signal pad groups configured to be electrically connected to the display element layer and arranged on the polymer layer. An upper substrate is arranged on a top surface of the display substrate. The lower substrate is removed to expose a partial portion or an entirety of a bottom surface of the display substrate. A flexible circuit board is arranged on the display substrate. The flexible circuit board includes a plurality of connection pad groups disposed thereon. The polymer layer is bent to form a first non-bending area that overlaps the upper substrate, a second non-bending area having a smaller area than the first non-bending area when viewed in a plan view and a bending area disposed between the first non-bending area and the second non-bending area. The second non-bending area has the signal pad groups arranged thereon.

In an embodiment, the flexible circuit board may include a plurality of connection pad groups configured to correspond to the signal pad groups, and the arranging of the flexible circuit board may further include forming each opening between the plurality of connection pad groups.

In an embodiment, the manufacturing method may further include, after the bending of the polymer layer, forming a protection layer in an area in which an exposed side surface of the upper substrate, an outer side surface of the bending area, and an exposed side surface of the lower substrate are covered.

BRIEF DESCRIPTION OF THE DRAWINGS

The accompanying drawings are included to provide a further understanding of the present inventive concepts, and are incorporated in and constitute a part of this specification. The drawings illustrate embodiments of the present inventive concepts and, together with the description, serve to explain principles of the inventive concepts. In the drawings.

DETAILED DESCRIPTION OF EMBODIMENTS

Figure 1:
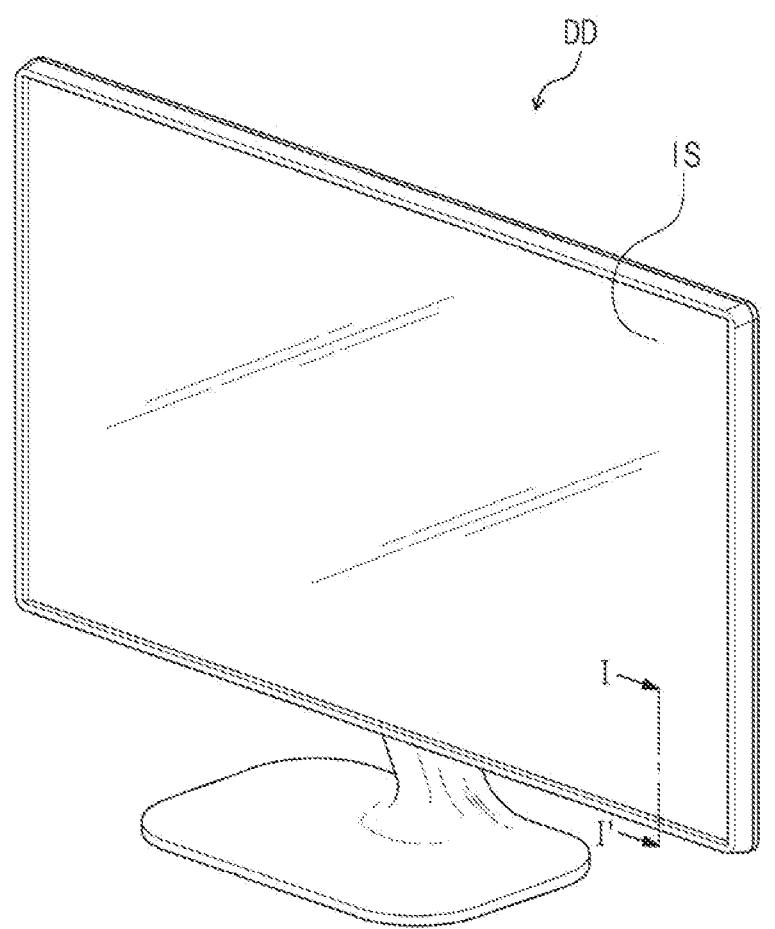
FIG. 1 is a perspective view of a display device according to an embodiment of the present inventive concepts.
Figure 1:
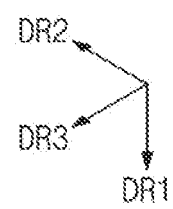

The present inventive concepts may be variously modified and realized in various forms, and thus embodiments will be exemplified in the drawings and described in detail hereinafter. However, it will be understood that the present inventive concepts are not intended to be limited to the embodiments set forth herein, and all changes, equivalents, and substitutions included in the technical scope and spirit of the present inventive concepts are included.

It will be understood that when an element or layer is referred to as being "on", "connected to" or "coupled to" another element or layer, it can be directly on, connected or coupled to the other element or intervening third elements may be present. When an element or layer is referred to as being "directly on", "directly connected to" or "directly coupled to" another element or layer, no intervening third elements may be present.

Like reference numerals in the drawings refer to like elements. In addition, in the drawings, the thickness and the ratio and the dimension of the element may be exaggerated for purposes of description of the present inventive concepts.

The term "and/or" includes any and all combinations of one or more of the associated items.

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the present inventive concepts. As used herein, the singular forms "a," "an." and "the" may be intended to include the plural forms as well, unless the context clearly indicates otherwise.

That an element is referred to as being disposed "on" another element includes that the element is disposed above or under the other element.

In addition, the terms such as "under". "lower", "on", and "upper" are used for explaining associations of elements illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which embodiments of the present inventive concepts belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, a display device and a manufacturing method for the same will be described with reference to the drawings.

Figure 2:
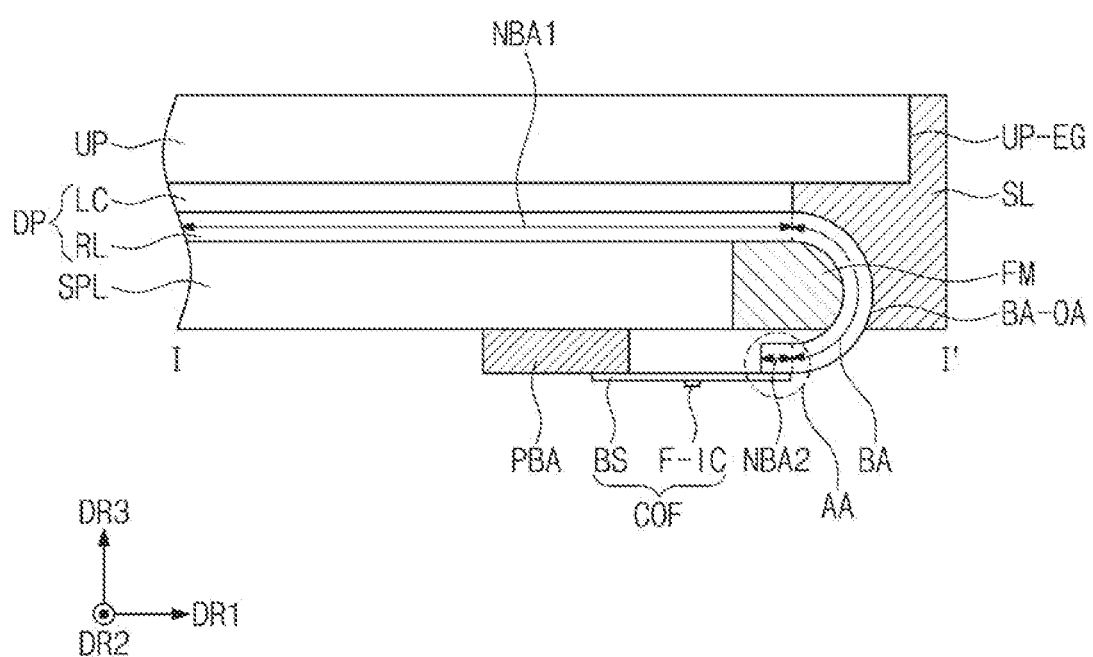
FIG. 2 is a cross-sectional view of a display device taken along line I-I' of FIG. 1 according to an embodiment of the present inventive concepts.
Figure 3:
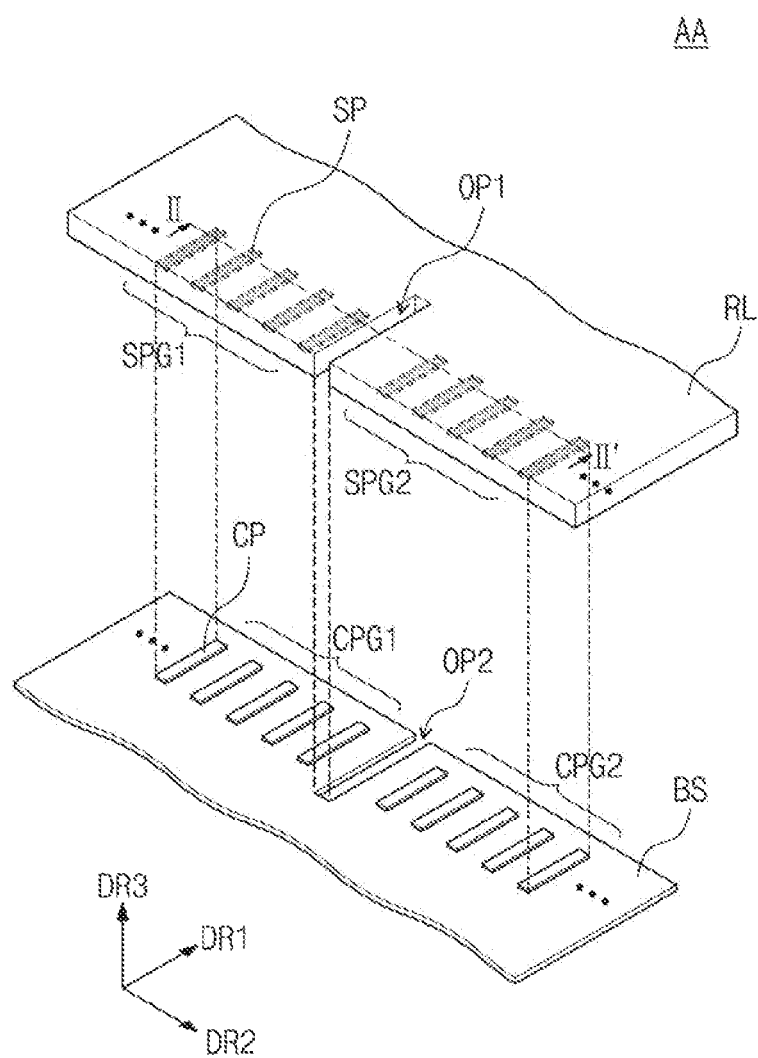
FIG. 3 is an exploded perspective view of a portion AA of the display device illustrated in FIG. 2 according to an embodiment of the present inventive concepts.
Figure 4:
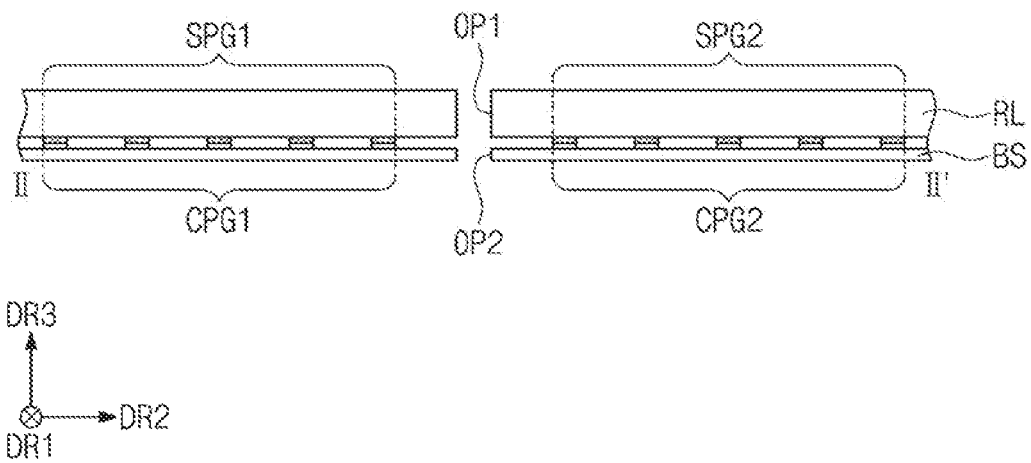
FIG. 4 is a cross-sectional view of a display device taken along line II-II' shown in FIG. 3 according to an embodiment of the present inventive concepts.

FIG. 1 is a perspective view of a display device according to an embodiment of the present inventive concepts. FIG. 2 is a cross-sectional view taken along a line I-I' of the display device in FIG. 1. FIG. 3 is an exploded perspective view of a portion of the display device illustrated in FIG. 2. FIG. 4 is a cross-sectional view taken along a line II-II' shown in FIG. 3 of a portion in a display device according to an embodiment of the present inventive concepts. Hereinafter, referring to FIGS. 1 to 4, a display device according to embodiments of the present inventive concepts will be described with reference to FIGS. 1 to 4.

Referring to FIG. 1, a display device DD according to an embodiment may be a frameless display device in which the size of the bezel area is minimized. In an embodiment, the display device DD may include a relatively shorter side extending along a first direction DR1 and a relatively longer side extending along a second direction DR2. However, embodiments of the present inventive concepts are not limited thereto. As shown in the embodiment of FIG. 1, the first direction DR1 and the second direction DR2 may be perpendicular to each other. However, in other embodiments the first direction DR1 and the second direction DR2 may cross each other at different angles. The display device DD may include a display surface IS that is extends in a plane defined in the first direction DR1 and the second direction DR2. A third direction DR3 may be perpendicular to the first and second directions DR1, DR2. The display device DD may display information on the display surface IS. In an embodiment, the display device DD may include a tablet, a notebook computer, a computer, or a television, etc. However, embodiments of the present inventive concepts are not limited thereto.

In the present specification, "when viewed in a plan view" may mean a state of being viewed in the third direction. The front surface (or top surface) and the rear surface (or bottom surface) of each member may be spaced apart in the third direction DR3. The first to third directions may be directions respectively indicated by the first to third directional axes DR1, DR2, and DR3, and refer to the same numerals. On the other hand, directions indicated by the first to third directions DR1, DR2, and DR3 are relative concepts to each other and may be changed to other directions.

Referring to the embodiments of FIGS. 1 to 4, the display device DD may include a display substrate DP, an upper substrate UP disposed on the display substrate DP (e.g., in the third direction DR3), and a flexible circuit board COF disposed below the display substrate DP (e.g., in the third direction DR3). For example, the upper substrate UP may be disposed on a top surface of the display substrate DP.

The display substrate DP may include a polymer layer RL, a display element layer LC disposed on the polymer layer RL, and signal pads SP. The polymer layer RL may include a first portion and a second portion that extends from at least one side of the first portion to be bent. The second portion may include a bending area BA. The first portion may be a portion corresponding to the display surface IS when viewed in a plan view. In an embodiment, the polymer layer RL may be a bendable film having a relatively small thickness.

The polymer RL may include a first non-bending area NBA1, a second non-bending NBA2, and the bending area BA disposed between the first non-bending area NBA1 and the second non-bending area NBA2. In an embodiment, the second non-bending area NBA2 may have a smaller area (e.g., area in a plane defined in the first and second directions DR1, DR2) than the first non-bending area NBA1 when viewed in a plan view. However, embodiments, of the present inventive concepts are not limited thereto. As shown in the embodiment of FIG. 2, the second non-bending area NBA2 may face and overlap the first non-bending area NBA1 (e.g., in the third direction DR3). For example, as shown in the embodiment of FIG. 2, the second non-bending area NBA2 may overlap the partial portion of the first non-bending area NBA1 that is adjacent to the bending area BA.

The polymer layer RL is bent toward a bottom side and upper portions of the polymer layer RL are covered with the upper substrate UP so as not to be visually recognized from the outside. For example, as shown in the embodiment of FIG. 2, the first non-bending area NBA1 and an upper portion of the bending area BA may be covered with the upper substrate UP. An outer side surface BA-OA of the bending area BA may be arranged more inwardly (e.g., in the first direction DR1) than the edge UP-EG of the upper substrate UP. The edge UP-EG of the upper substrate UP may correspond to an exposed side of the upper substrate UP and may be an outermost edge of the upper substrate UP (e.g., in the first direction DR1).

The display element layer LC may be disposed on the first non-bending area NBA1 and a plurality of signal pads SP may be arranged on the second non-bending area NBA2. For example, as shown in the embodiment of FIG. 2, a lower surface of the display element layer LC may directly contact an upper portion of the polymer layer RL, such as an upper portion of the first non-bendable area NBA1. As shown in the embodiment of FIG. 3, the plurality of signal pads SP may be arrayed in the second direction DR2. For example, the plurality of signal pads SP may be arranged in an array of signal pads SP which extend longitudinally in the first direction DR1 and are spaced apart from each other in the second direction DR2. The display element layer LC may receive electrical signals from the signal pads SP to emit light or control the transmittance of the light. For example, in an embodiment, the display element layer LC may include an organic light emitting element layer, a quantum light-emitting element layer, or a liquid crystal element layer.

The signal pads SP may be disposed in the second non-bending area NBA2. As shown in the embodiment of FIG. 3, the signal pads SP may be divided into a first signal pad group SPG1 and a second signal pad group SPG2 that are separated from each other in the second direction DR2. A first opening OP1 may be defined between the first signal pad group SPG1 and the second signal pad group SPG2. FIG. 3 illustrates only the first signal pad group SPG1 and the second signal pad group SPG2 separated from each other. However, embodiments of the present inventive concepts are not limited thereto. For example, in another embodiment, the display device may include three or more signal pad groups separated from each other, and an opening may be disposed between adjacent signal pad groups to define the signal pad groups.

The polymer layer RL may have flexibility. For example, in an embodiment, the polymer layer RL may include polyimide. When stress is applied in a state in which heat is provided, the polymer layer RL may be stretched.

The polymer layer RL may include the first opening OP1 defined between the adjacent first signal pad group SPG1 and the second signal pad group SPG2 to reduce the deformation of signal pads SP, which occurs due to the accumulation of stretching of the polymer layer RL when the display substrate DP and the flexible circuit board COF are pressed with heat. For example, without the first opening OP disposed between the signal pad groups SPG1 and SPG2, the stretching caused by heat may be accumulated on the polymer layer RL, and may result in a large deformation of the signal pads SP. On the other hand, according to an embodiment of the present inventive concepts, the polymer layer RL of the display device DD includes the first opening OP1 between the first and second signal pad groups SPG1 and SPG2 to disperse the stress on the polymer layer RL and to reduce the deformation of the signal pads SP. As shown in the embodiment of FIG. 3, the length of the first opening OP1 in the first direction DR1 (e.g., the longitudinal length of the first opening OP1) may be greater than the length of each of the signal pads SP in the first direction DR1 (e.g., the longitudinal length of each of the signal pads SP).

As shown in the embodiment of FIG. 2, the display device DD may further include a support layer SPL disposed under the first non-bending area NBA1 (e.g., in the third direction DR3). For example, the support layer SPL may be disposed under at least a partial portion of the first non-bending area NBA1. The support layer SPL may support the polymer layer RL which may be relatively thin. In an embodiment, the support layer SPL may include graphite. The front surface of the support layer SPL may overlap the upper substrate UP (e.g., in the third direction DR3). The support layer SPL may be spaced apart from the bending area BA.

In an embodiment, the display device DD may further include an impact absorption layer FM arranged between a side surface of the support layer SPL (e.g., a lateral side surface of the support layer SPL in the first direction DR1) and the bending area BA of the polymer layer RL. The impact absorption layer FM may directly contact an inner surface of the bending area BA of the polymer layer RL. The impact absorption layer FM may have flexibility. The impact absorption layer FM may reduce or eliminate cracks or wrinkles that may be generated while the bending area BA of the polymer layer RL is bent.

In an embodiment, the display device DD may further include a protection layer SL that covers an outer side surface BA-OA of the bending area BA and an exposed side surface of the upper substrate UP. The protection layer SL may fix the bent state of the polymer layer RL in the bending area BA to maintain the bent state.

The upper substrate UP may overlap the first non-bending area NBA1 (e.g., in the third direction DR3) and may be disposed on the display substrate DP. For example, as shown in FIG. 2, a lower portion of the upper substrate UP may directly contact an upper portion of the display substrate DP. In an embodiment, the area of the upper substrate UP (e.g., an area in a plane defined in the first and second directions DR1, DR2) may be greater than the area of the bent display substrate DP when viewed in a plan view. When the area of the upper substrate UP is less than the area of the display substrate DP disposed thereunder when viewed in a plan view, a separate frame is required so that the display substrate DP is not visually recognized by the user. However, as shown in the embodiment of FIG. 2, the area of the upper substrate UP is greater than the area of the display substrate DP and the upper substrate UP covers the entirety of the display substrate DP, and thus the display device. Therefore the bezel area having a reduced size may be implemented. In an embodiment, the upper substrate UP may be a glass substrate.

The flexible circuit board COF may be disposed on the second non-bending area NBA2. As shown in the embodiments of FIGS. 2-3, the flexible circuit board COF may include a base substrate BS, a plurality of connection pads CP arranged on the base substrate BS, and a driving element F-IC for receiving an electrical signal from the connection pads CP. In an embodiment, the base substrate BS may include polyimide and the connection pads CP may include copper Cu. The base substrate BS may have flexibility, and may be stretched when a stress is applied thereto in a heated state. The connection pads CP may be arrayed in the second direction DR2.

The connection pads CP may be divided into a first connection pad group CPG1 and a second connection pad group CPG2 that are separated from each other (e.g., in the second direction DR2). The base substrate BS may include a second opening OP2 defined between the first connection pad group CPG1 and the second connection pad group CPG2 (e.g., in the second direction DR2). FIG. 4 illustrates only the first connection pad group CPG1 and the second connection pad group CPG2 separated from each other. However, embodiments of the present inventive concepts are not limited thereto. A display device according to an embodiment of the present inventive concepts may include three or more connection pad groups that are separated from each other, and each opening may be defined between adjacent connection pad groups.

The flexible circuit board COF may include the second opening OP2 defined between the first connection pad group CPG1 and the second connection pad group CPG2 (e.g., in the second direction DR2) to reduce the deformation of the connection pads CP which occurs due to the accumulation of stretching of the base substrate BS when the display substrate DP and the flexible circuit board COF are pressed with heat. For example, when the second opening OP2 is not formed between the first and second connection pad groups CPG1 and CPG2, the stretching of the base substrate BS is accumulated and may cause a large deformation of the connection pads CP. However, the base substrate BS of the display device DD according to an embodiment of the present inventive concepts may include the second opening OP2 between the first and second connection pad groups CPG1 and CPG2 to disperse the stress on the base substrate BS and to reduce the deformation of the connection pads CP.

The display substrate DP may be disposed above the flexible circuit board COF. The connection pads CP arranged on the flexible circuit board COF may be arranged to overlap the signal pads SP of the display substrate DP (e.g., in the third direction DR3).

As shown in the embodiments of FIGS. 3-4, the second opening OP2 may be arranged to overlap the first opening OP (e.g., in the third direction DR3). However, embodiments of the present inventive concepts are not limited thereto. When the signal pads SP and the connection pads CP may be arranged without misalignment, the position of the second opening OP2 is not limited. For example, referring to FIG. 5, the second opening OP2 may be arranged so as not to overlap the first opening OP1 (e.g., in the third direction DR3) or to only partially overlap the first opening OP1. For example, the second opening OP2 may be offset from the first opening OP1 in the second direction DR2.

Figure 5:
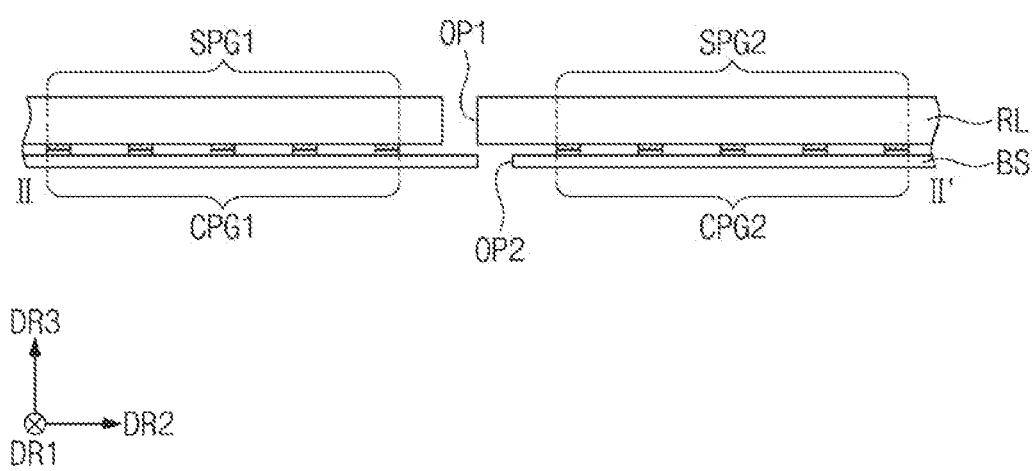
FIG. 5 is a cross-sectional view of a display device taken along line II-II' shown in FIG. 3 according to an embodiment of the present inventive concepts.

While the embodiment of FIG. 5 illustrates that the openings are defined in both the polymer layer RL and the flexible circuit board COF, embodiments of the present inventive concepts are not limited thereto. For example, when the signal pads SP and the connection pads CP may correspond to each other without misalignment, the opening may be defined in only one of the polymer layer RL and the flexible circuit board COF. For example, the opening may be defined in the polymer layer RL but not in the flexible circuit board COF, or may be defined in the flexible circuit board COF but not in the polymer layer RL.

Figure 6:
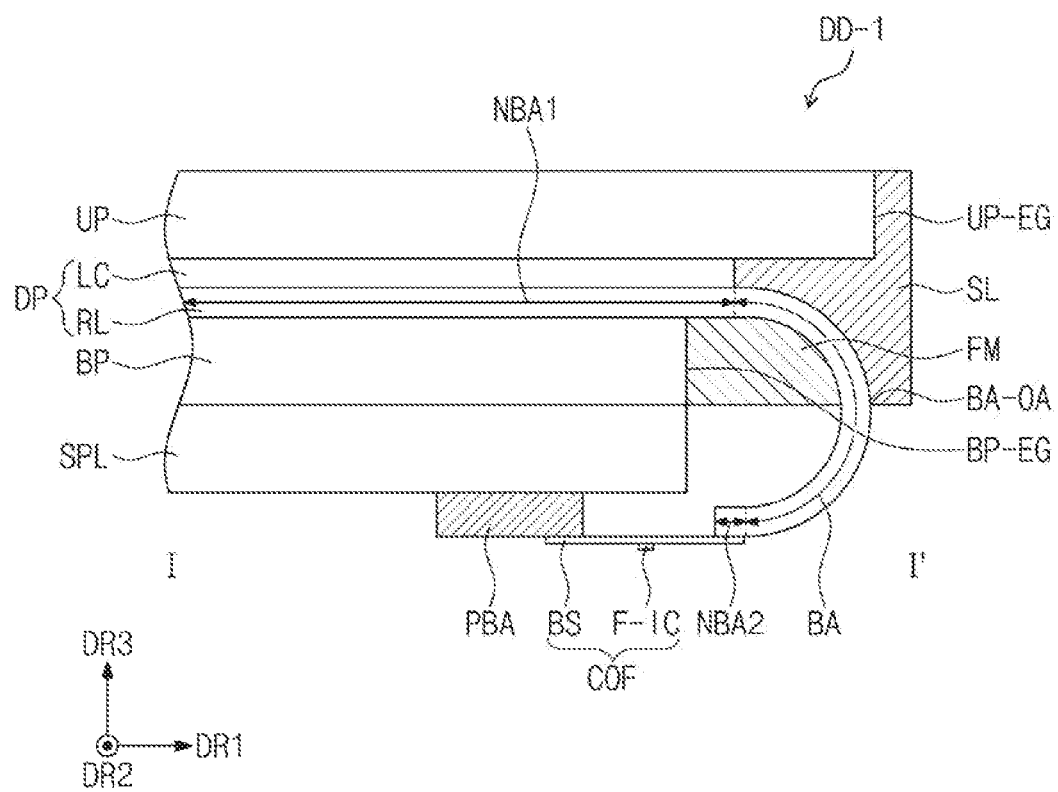
FIG. 6 is a cross-sectional view of a display device taken along line I-I' shown in FIG. 1 according to an embodiment of the present inventive concepts.

Hereinafter, a display device according to embodiments of the present inventive concepts will be described with reference to FIGS. 6 to 8B. In the description of the display device according to the embodiments shown in FIGS. 6 to 8B, a description of substantially same elements as described with reference to FIGS. 1 to 6 will not be repeated for convenience of explanation, and elements that are different from the embodiment described with reference to the embodiments of FIGS. 1 and 6 will be mainly described FIG. 6 is a cross-sectional view taken along a line I-I' shown in FIG. 1 of the display device DD-1 according to an embodiment of the present inventive concepts. The display device DD-1 is different from the display device DD (see FIG. 1) described with reference to the embodiments of FIGS. 1 to 5 in that the display device DD-1 further has a lower substrate BP under the display substrate DP.

Referring to FIG. 6, the display device DD-1 according to an embodiment may further include the lower substrate BP disposed under the display substrate DP (e.g., in the third direction DR3). In an embodiment, the lower substrate BP may be a glass substrate. However, embodiments of the present inventive concepts are not limited thereto.

The lower substrate BP may be arranged to overlap the first non-bending area NBA1 of the polymer layer RL (e.g., in the third direction DR3). The area of the lower substrate BP (e.g., an area in a plane defined in the first and second directions DR1, DR2) may be less than the area of the upper substrate UP when viewed in a plan view. The area of the lower substrate BP may be less than the area of the first non-bending area NBA1 of the polymer layer RL when viewed in a plan view. The edge BP-EG of the lower substrate BP may be arranged more inwardly (e.g., in the first direction DR1) than the edge UP-EG of the upper substrate UP (e.g., an outermost edge of the upper substrate). The edge BP-EG of the lower substrate BP may correspond to an exposed side surface of the support layer SPL.

Figure 7A:
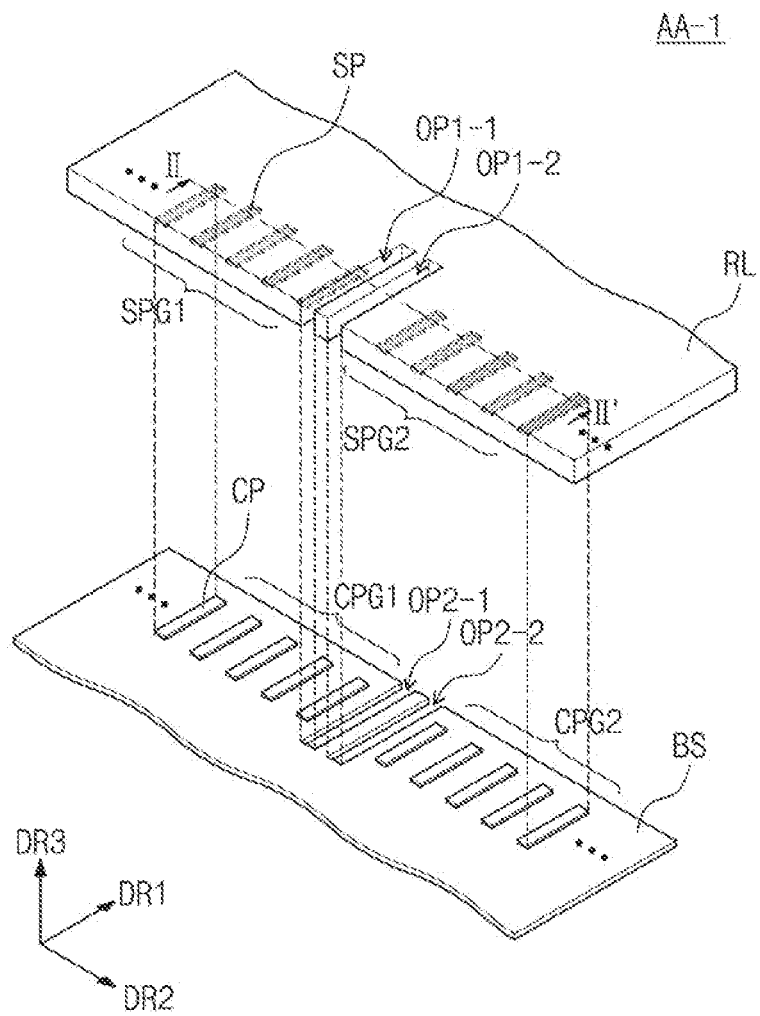
FIG. 7A is an exploded perspective view of a portion of a display device according to an embodiment of the present inventive concepts.
Figure 7B:
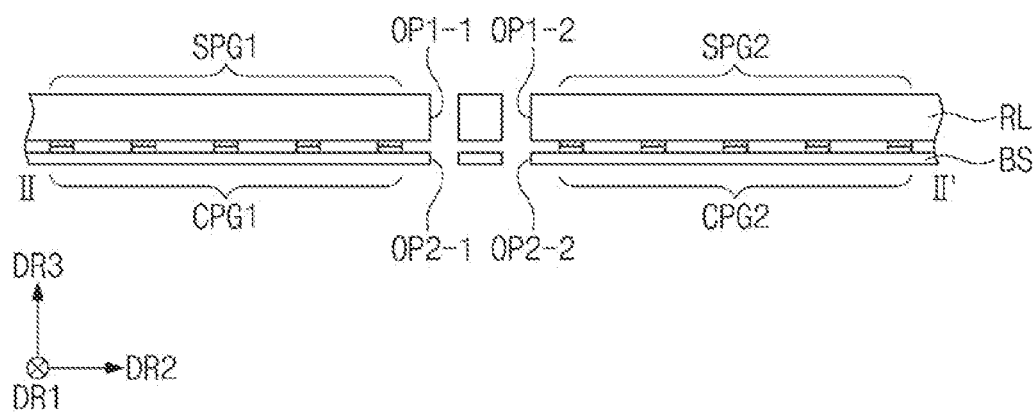
FIG. 7B is a cross-sectional view of a display device taken along line II-II' shown in FIG. 7A according to an embodiment of the present inventive concepts.

FIG. 7A is an exploded perspective view of a portion of a display device of an embodiment of the present inventive concepts. FIG. 7A is taken from a similar portion as area AA in FIG. 2 and is designated area AA-1. FIG. 7B is a cross-sectional view taken along a line II-II' of the portion of the display device shown in FIG. 7A. A display device according to an embodiment will be described with reference to FIGS. 7A and 7B.

Referring to the embodiments of FIGS. 7A and 7B, the display device is different from the display device DD in the embodiments of FIGS. 1 to 5 based on a plurality of first openings OP1-1 and OP1-2 being defined between adjacent signal pads SP in the polymer layer RL (e.g., in the second direction DR2), and a plurality of second openings OP2-1 and OP2-2 are defined between adjacent connection pads CP in the flexible circuit board COF (e.g., in the second direction DR2). For example, the embodiments of FIGS. 7A and 7B illustrate two first openings OP1-1 and OP1-2 between adjacent signal pads SP and two second openings OP2-1 and OP2-2 between adjacent connection pads CP. However, embodiments of the present inventive concepts are not limited thereto. For example, in an embodiment, the numbers of the first openings between adjacent signal pads SP and the second openings between adjacent connection pads may be three or more.

Figure 8A:
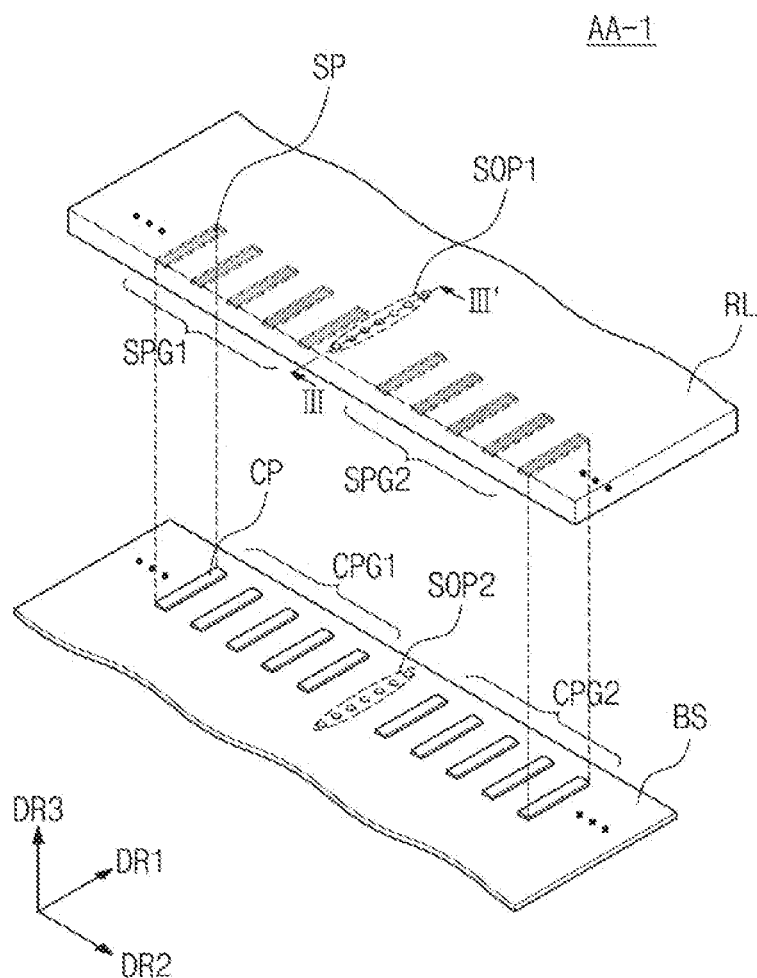
FIG. 8A is an exploded perspective view of a portion of a display device according to an embodiment of the present inventive concepts.
Figure 8B:
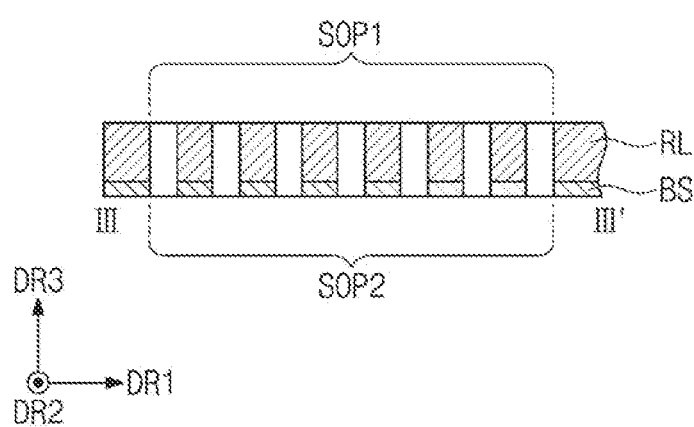
FIG. 8B is a cross-sectional view of a display device taken along line III-III' of FIG. 8A according to an embodiment of the present inventive concepts.

FIG. 8A is an exploded perspective view of a portion of a display device according to an embodiment of the present inventive concepts. FIG. 8B is a cross-sectional view taken along a line III-III' of the portion of the display device shown in FIG. 8A. A display device according to an embodiment of the present inventive concepts will be described with reference to FIGS. 8A and 8B.

Referring to the embodiments of FIGS. 8A and 8B, the display device is different from the display device DD described with reference to the embodiments of FIGS. 1 to 5 based on a plurality of first sub-openings SOP1 being defined in correspondence between the adjacent first and second signal pad groups SPG1 and SPG2 in the polymer layer RL, and a plurality of second sub-openings SOP2 are defined in correspondence between the adjacent first and second connection pad groups CPG1 and CPG2 in the flexible circuit board COF.

In the display device according to an embodiment of the present inventive concepts, the plurality of first sub-openings SOP1 may be defined between adjacent signal pads SP in the polymer layer RL (e.g., in the second direction DR2) and the plurality of second sub-openings SOP2 may be defined between the connection pads CP in the flexible circuit board COF (e.g., in the second direction DR2). The first sub-openings SOP1 may be arrayed in the first direction DR1. The second sub-openings SOP2 may be arrayed in the first direction DR1. For example, the first sub-openings SOP1 may be spaced apart from each other in the first direction DR1 and the second sub-openings SOP2 may be spaced apart from each other in the first direction DR1. In an embodiment, the shapes of each of the first and second sub-openings SOP and SOP2 may be circular (e.g., in a plan view in a plane defined in the first and second directions DR1, DR2). However, the shapes of the first and second sub-openings SOP1 and SOP2 are not particularly limited if the first and second sub-openings SOP1 and SOP2 prevent the accumulated stretching of each of the polymer layer RL and the base substrate BS to reduce the deformation of the signal pads SP and the connection pads CP. For example, the first and second sub-openings SOP and SOP2 may have various different shapes.

Hereinafter, with reference to FIGS. 9 to 13B, and with reference to FIGS. 2 to 4, and 6 again, a manufacturing method for the display device according to embodiments of the present inventive concepts will be described.

Figure 9:
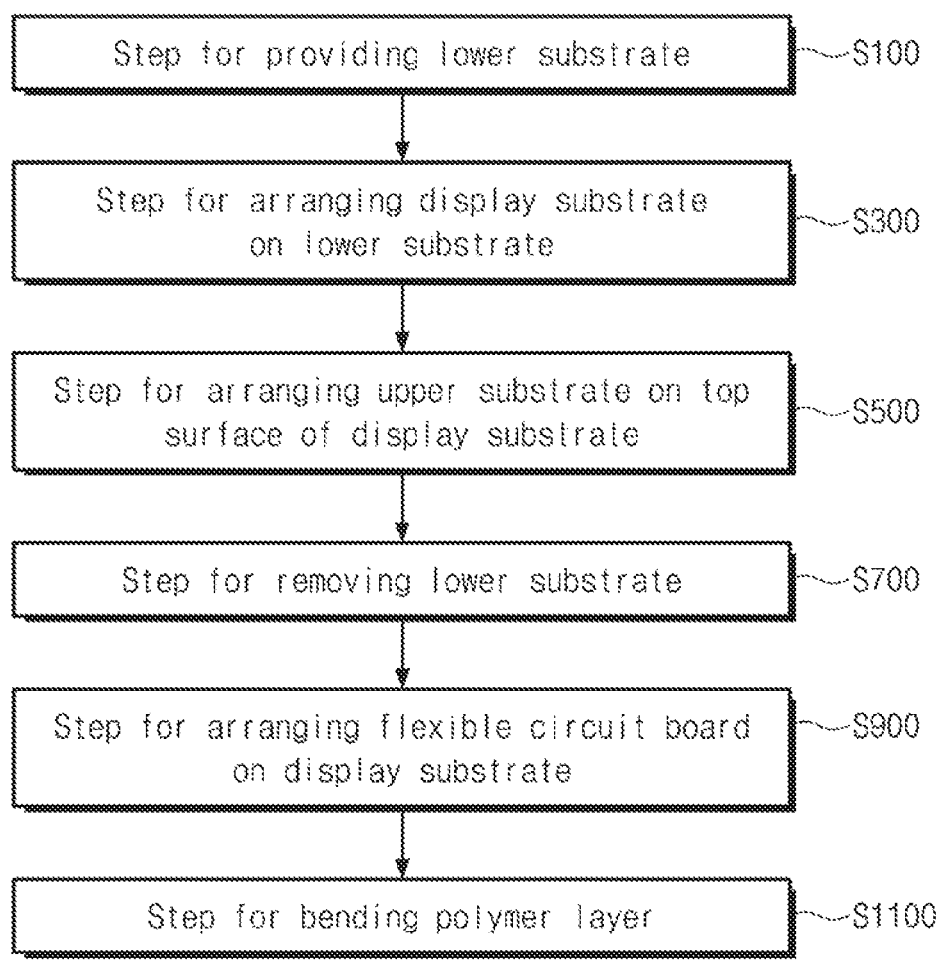
FIG. 9 is a flowchart of a manufacturing method for a display device according to an embodiment of the present inventive concepts.

FIG. 9 is a flowchart of the manufacturing method of a display device according to an embodiment of the present inventive concepts. FIGS. 10 to 13B respectively illustrate the steps of a manufacturing method for a display device according to embodiments of the present inventive concepts. In the description of the manufacturing method for a display device according to the embodiments shown in FIGS. 10 to 13B, a description of the same elements described with reference to the embodiments of FIGS. 1 to 8B will not be repeated for convenience of explanation, and the features of the manufacturing method will be described in detail.

With reference to the embodiment of FIG. 9, the manufacturing method of the display device DD includes a step in block S100 of providing a lower substrate, a step in block S300 of arranging a display substrate on the lower substrate, a step in block S500 of arranging an upper substrate on the display substrate, a step in block S700 for removing the lower substrate, a step in block S900 of arranging a flexible circuit board on the display substrate, and a step in block S1100 of bending a polymer layer.

Figure 10:
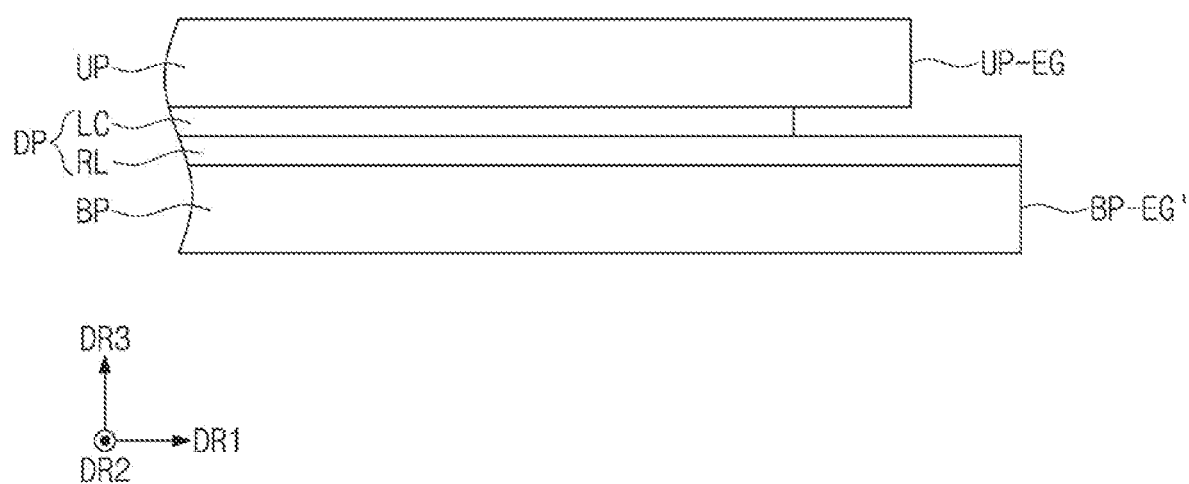
FIGS. 10 to 13B respectively illustrate the steps of a manufacturing method for a display device according to embodiments of the present inventive concepts.

Referring to the embodiment of FIG. 10, in block S300 the step of arranging the display substrate DP on the lower substrate BP may include providing the display substrate DP including the polymer layer RL having a substantially same area as the lower substrate BP when viewed in a plan view (e.g., in a plane defined in the first and second directions DR1, DR2). However, embodiments of the present inventive concepts are not limited thereto. For example, the area of the polymer layer RL is not limited if the step in block S1100 of bending the polymer layer RL is performed after the step in block S700 of removing the lower substrate BP, which will be described later. For example, in some embodiments of the present inventive concepts, the area of the polymer layer RL may be less than or greater than the area of the lower substrate BP.

The step in block S500 of arranging the upper substrate UP on the display substrate DP may include arranging the upper substrate UP having an area that is less than the area of the polymer layer RL before being bent when viewed in a plan view. However, embodiments of the present inventive concepts are not limited thereto. For example, the area of the upper substrate UP is not limited if the display substrate DP arranged under the upper substrate UP is not visually recognized from the outside by the user due to the upper substrate UP after the step in block S1100 of bending the polymer layer RL. For example, in some embodiments, the area of the upper substrate UP may be substantially the same as the area of the polymer layer RL before being bent, or may be greater than the area of the polymer layer RL when viewed in a plan view.

Figure 11A:
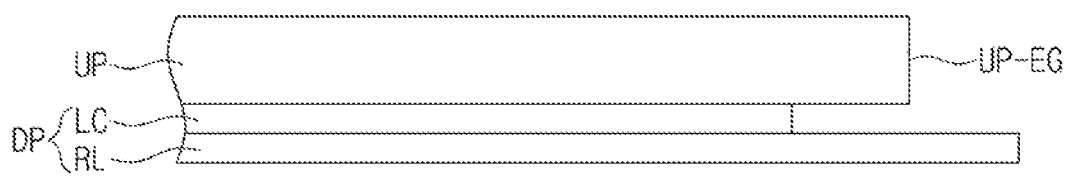
Figure 11A:
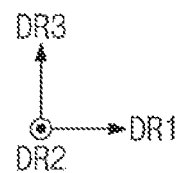
Figure 11B:
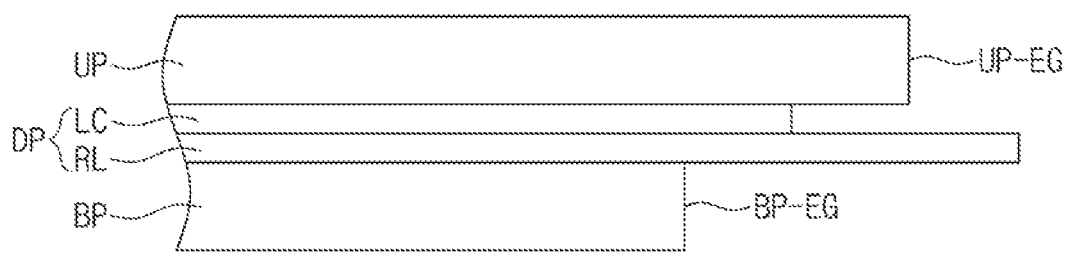
Figure 11B:
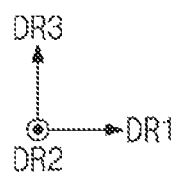

Referring to the embodiments of FIGS. 11A and 11B, the step in block S700 of removing the lower substrate BP to expose a partial portion or the entirety of the bottom surface of the display substrate DP may be reduce the area of the polymer layer RL before being bent when viewed in a plan view. For example, the area of the lower substrate BP may be reduced when viewed in a plan view so as to secure the bending area BA (see FIG. 2) of the polymer layer RL. In an embodiment, the step of removing a partial portion or the entirety of the lower substrate BP may be performed by cutting using a laser or by means of a punching or etching method, etc., using a metal mold.

Referring to the embodiment of FIG. 4, the step in block S900 of arranging the flexible circuit plate COF on the display substrate DP may be to arrange the first and second signal pad groups SPG1 and SPG2 and the first and second connection pad groups CPG1 and CPG2 so as to correspond to each other (e.g., overlap in the third direction DR3). For example, the first opening OP1 and the second opening OP2 be arranged to correspond to each other (e.g., overlap in the third direction DR3). However, embodiments of the present inventive concepts are not limited thereto. For example, in an embodiment, the first opening OP may be arranged to not correspond to the second opening OP2 or to only partially correspond to the second opening OP2, and the signal pad groups SPG1 and SPG2 may be arranged to correspond to the connection pad groups CPG1 and CPG2.

Figure 12A:
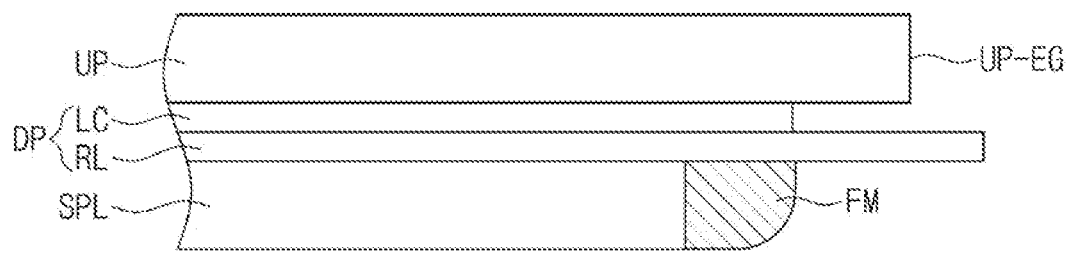
Figure 12B:
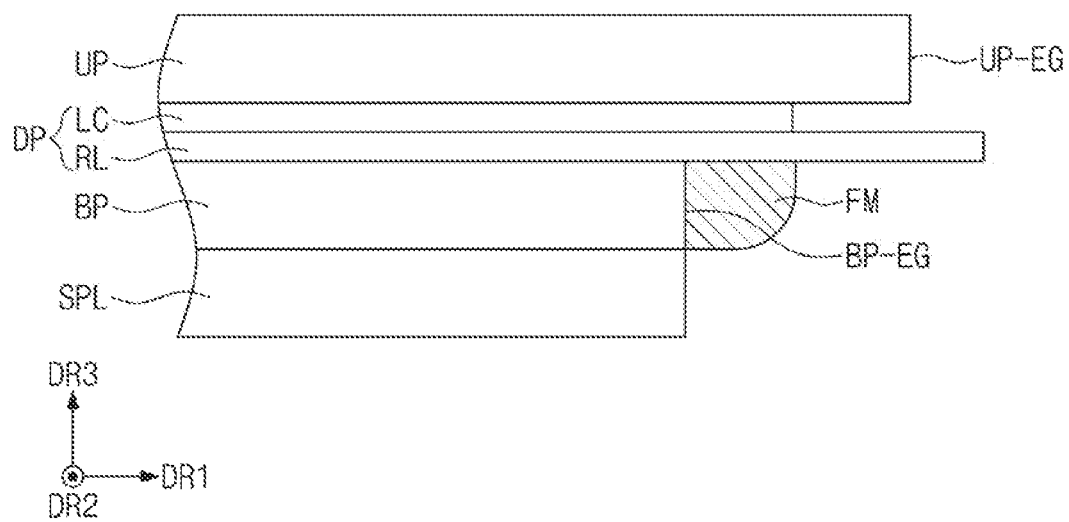

Referring to the embodiments of FIGS. 12A and 12B, the step in block S1100 of bending the polymer layer RL may include a step of arranging the impact absorption layer FM for covering the bottom surface of the polymer layer RL and the lateral side surface of the lower substrate BP or the lateral side surface of the support layer SPL. When a portion of the lower substrate BP is removed as shown in the embodiment of FIG. 12B, the step of arranging the impact absorption layer FM may be a step of disposing the impact absorption layer FM for covering the bottom surface of the polymer layer RL and the exposed lateral side surface of the lower substrate BP. When the entire lower substrate BP is removed as shown in the embodiment of FIG. 12A, the step of arranging the impact absorption layer FM may be a step of disposing the impact absorption layer FM for covering the bottom surface of the polymer layer RL and the exposed side surface of the support layer SPL. The inclusion of the step of arranging the impact absorption layer FM may result in the reduction of cracks or wrinkles in the bending area BA (see FIG. 4) when the polymer layer RL is bent.

Figure 13A:
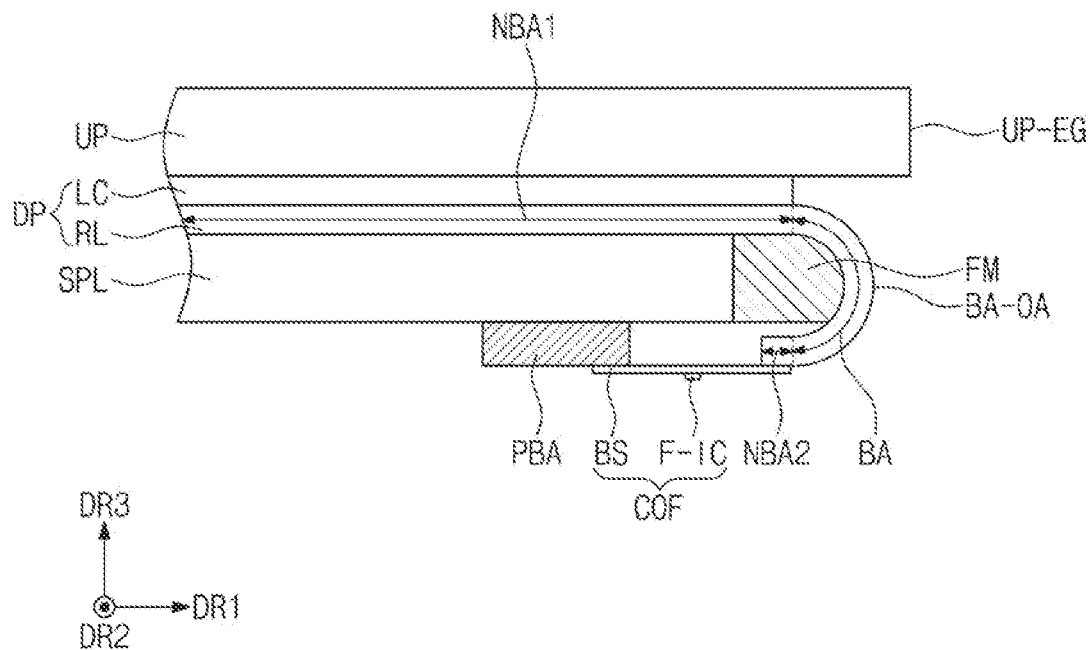
Figure 13B:
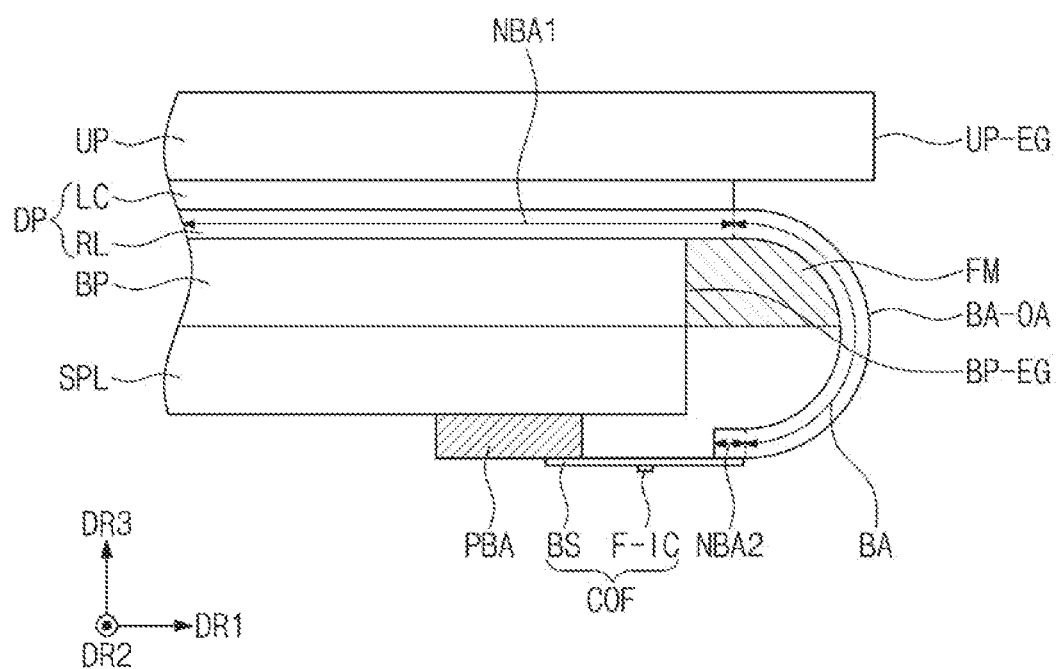

Referring to the embodiments of FIGS. 13A and 13B, the step in block S1100 of bending the polymer layer RL may include bending the polymer layer RL to allow the polymer layer RL, such as the first non-bending area NBA1 and an upper portion of the polymer layer RL in the bending area to be covered with the upper substrate UP. For example, since the area of the upper substrate UP (e.g., an area in a plane defined in the first and second directions DR1, DR2) is greater than the area of the bent polymer layer RL when viewed in a plan view, the polymer layer RL may not be visually recognized by a user and an additional component such as a frame may not be needed for preventing the polymer layer RL from being viewed by the user.

Referring to the embodiment of FIG. 2 again, after the step in block 1100 of bending the polymer layer RL is performed, the manufacturing method for the display device according to an embodiment may further include a step of arranging the protection layer SL in an area corresponding to the exposed side surface of the upper substrate UP, the bending area BA, and the exposed side surface of the support layer SPL. The protection layer SL may be arranged from the upper substrate UP to the bending area BA of the polymer RL so that the polymer layer RL may maintain the bent state. For example, the protection layer SL may cover the outer side surface BA-OA of the bending area BA and the exposed side surface of the upper substrate UP.

Referring to the embodiment of FIG. 6 again, after the step in block S1100 of bending the polymer layer RL is performed, the manufacturing method for the display device according to an embodiment may further include a step of arranging the protection layer SL in an area corresponding to the exposed side surface of the upper substrate UP, the bending area BA, and the edge BP-EG of the lower substrate BP. The protection layer SL may be arranged from the upper substrate UP to the bending area BA of the polymer RL so that the polymer layer RL may maintain the bent state. For example, the protection layer SL may cover the outer side surface BA-OA of the bending area BA and the exposed side surface of the upper substrate UP.

The embodiment may provide the display device without a frame and the display device includes the display substrate including the bent polymer layer, and the upper substrate being arranged on the display substrate and having the area that is greater than the area of the bent polymer layer when viewed in a plan view.

In an embodiment of the present inventive concepts, the manufacturing method for a display device includes a step of removing a portion of the lower substrate and a step in block S1100 of bending the polymer layer, and thus, the display device may be manufactured which includes the upper substrate having an area that is greater than the bent polymer layer when viewed in a plan view and a frame is not included in the display device.

An embodiment of the present inventive concepts may provide a display device having a reduced bezel area by including a bendable display substrate and the upper substrate having a greater area than the bent display substrate.

An embodiment of the present inventive concepts may provide a manufacturing method for a display device having a reduced bezel area, the manufacturing method including a step of removing a portion of the lower substrate so that the area of the lower substrate is less than the area of the upper substrate, and a step of bending the display substrate.

While the present inventive concepts have been described with reference to embodiments thereof, it will be clear to those of ordinary skill in the art to which the present inventive concepts pertain that various changes and modifications may be made to the described embodiments without departing from the spirit and technical area of the present inventive concepts. Thus, the scope of the present inventive concepts shall not be restricted or limited by the foregoing description, but be determined by the broadest permissible interpretation of the following claims.

What is claimed is:

1. A display device comprising:
    a display substrate comprising:
        a polymer layer including a first non-bending area, a second non-bending area that overlaps the first non-bending area when viewed in a plan view, and a bending area arranged between the first non-bending area and the second non-bending area,
        a display element layer disposed on the polymer layer, and
        a plurality of signal pad groups disposed in the second non-bending area and configured to be electrically connected to the display element layer;
    an upper substrate disposed on a top surface of the display substrate; and
    a flexible circuit board comprising a plurality of connection pad groups arranged in correspondence to the signal pad groups,
    wherein an area of the upper substrate is larger than an area of the display substrate when viewed in a plan view,
    a protection layer configured to cover an outer side surface of the bending area and an exposed side surface of the upper substrate.

2. The display device of claim 1, wherein the polymer layer comprises polyimide.

3. The display device of claim 1, wherein:
    the signal pad groups comprise a plurality of signal pads arrayed in a first direction,
    wherein an opening is defined in the polymer layer between adjacent signal pad groups of the plurality of signal pad groups.

4. The display device of claim 3, wherein a length of the opening in a second direction perpendicular to the first direction is greater than a length of each signal pad of the plurality of signal pads in the second direction.

5. The display device of claim 3, wherein the opening comprises a plurality of sub-openings arrayed and defined in a second direction perpendicular to the first direction.

6. The display device of claim 1, wherein:
    the connection pad groups comprise a plurality of connection pads arrayed in a first direction; and
    an opening is defined in the flexible circuit board between adjacent connection pad groups of the plurality of connection pad groups.

7. The display device of claim 6, wherein a length of the opening in a second direction perpendicular to the first direction is greater than a length of each connection pad of the plurality of connection pads in the second direction.

8. The display device of claim 6, wherein the opening comprises a plurality of sub-openings arrayed and defined in a second direction perpendicular to the first direction.

9. The display device of claim 1, wherein:
    a first opening is defined in the polymer layer between adjacent signal pad groups of the plurality of signal pad groups; and
    a second opening is defined in the flexible circuit board between adjacent connection pad groups of the plurality of connection pad groups,
    wherein the first opening overlaps the second opening.

10. The display device of claim 1, further comprising a lower substrate disposed on a bottom surface of the polymer layer and overlapping the first non-bending area.

11. The display device of claim 10, wherein an area of the upper substrate is greater than an area of the lower substrate when viewed in a plan view.

12. The display device of claim 11, wherein the upper substrate and the lower substrate are glass substrates.

13. The display device of claim 1, further comprising:
    a support layer disposed on a bottom surface of the first non-bending area and spaced apart from the bending area.

14. The display device of claim 13, further comprising:
    an impact absorption layer arranged between the support layer and the bending area.

15. A display device comprising:
    a display substrate comprising:
        a polymer layer including a first non-bending area, a second non-bending area that overlaps the first non-bending area when viewed in a plan view, and a bending area arranged between the first non-bending area and the second non-bending area,
        a display element layer disposed on the polymer layer, and
        a plurality of signal pad groups disposed directly on the polymer layer in the second non-bending area and configured to be electrically connected to the display element layer;
    an upper substrate disposed on a top surface of the display substrate; and
    a flexible circuit board comprising a plurality of connection pad groups arranged in correspondence to the signal pad groups,
    wherein an outer side surface of the bending area is arranged more inwardly than an outermost edge of the upper substrate.

16. The display device of claim 15, further comprising:
    a lower substrate disposed on a bottom surface of the display substrate,
    wherein an edge of the lower substrate is arranged more inwardly than the outermost edge of the upper substrate.

17. A manufacturing method for a display device, the manufacturing method comprising:
    providing a lower substrate;
    arranging a display substrate on the lower substrate, the display substrate including a polymer layer, a display element layer disposed on the polymer layer, and a plurality of signal pad groups configured to be electrically connected to the display element layer and arranged on the polymer layer;
    arranging an upper substrate on a top surface of the display substrate;
    removing the lower substrate to expose a partial portion or an entirety of a bottom surface of the display substrate;
    arranging a flexible circuit board on the display substrate, the flexible circuit board including a plurality of connection pad groups disposed thereon;
    bending the polymer layer to form a first non-bending area that overlaps the upper substrate, a second non-bending area having a smaller area than the first non-bending area when viewed in a plan view, the second non-bending area having the signal pad groups arranged thereon, and a bending area disposed between the first non-bending area and the second non-bending area; and after the bending of the polymer layer, forming a protection layer to cover an exposed side surface of the upper substrate, an outer side surface of the bending area, and an exposed side surface of the lower substrate.

18. The manufacturing method of claim 17, wherein:

the flexible circuit board includes a plurality of connection pad groups arranged to correspond to the signal pad groups, and the arranging of the flexible circuit board further comprises forming each opening between adjacent connection pad groups of the plurality of connection pad groups.

* * * * *